United States Patent [19]
Nelson

[11] Patent Number: 5,912,802
[45] Date of Patent: *Jun. 15, 1999

[54] DUCTED OPPOSING BONDED FIN HEAT SINK BLOWER MULTI-MICROPROCESSOR COOLING SYSTEM

[75] Inventor: Daryl James Nelson, Beaverton, Oreg.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/928,028

[22] Filed: Sep. 11, 1997

Related U.S. Application Data

[63] Continuation of application No. 08/643,736, May 6, 1996, abandoned, which is a continuation of application No. 08/269,431, Jun. 30, 1994, abandoned.

[51] Int. Cl.⁶ ........................................... H05K 7/20
[52] U.S. Cl. ..................... 361/695; 165/185; 361/690
[58] Field of Search ................... 165/80.2, 80.3, 165/185; 174/16.3; 257/706, 707, 712, 713, 722; 361/687–697, 704, 707, 709, 715, 717–718, 722

[56] References Cited

U.S. PATENT DOCUMENTS

| | | |
|---|---|---|
| 4,092,697 | 5/1978 | Spaight . |
| 4,326,215 | 4/1982 | Suzuki et al. . |
| 4,360,141 | 11/1982 | Kensrue . |
| 4,415,025 | 11/1983 | Horvath . |
| 4,530,003 | 7/1985 | Blair et al. . |
| 4,538,168 | 8/1985 | Van Dyk Soerewyn . |
| 4,603,374 | 7/1986 | Wasielewski . |
| 4,605,058 | 8/1986 | Wilins . |
| 4,682,268 | 7/1987 | Okano et al. ........................... 361/697 |
| 4,771,365 | 9/1988 | Cichocki et al. . |
| 4,777,560 | 10/1988 | Herrell et al. . |
| 4,833,567 | 5/1989 | Saaski et al. . |

(List continued on next page.)

FOREIGN PATENT DOCUMENTS

| | | | |
|---|---|---|---|
| 2585918 | 2/1987 | France ................................... 361/694 |
| 1150722 | 7/1963 | Germany .............................. 361/695 |
| 3710198 | 3/1987 | Germany .............................. 361/690 |
| 60-7155 | 1/1985 | Japan . |
| 137042 | 7/1985 | Japan . |
| 39555 | 2/1986 | Japan . |
| 63-47959 | 2/1988 | Japan . |
| 63-55966 | 3/1988 | Japan . |

(List continued on next page.)

OTHER PUBLICATIONS

"High Performance Air Cooled Heat Sinks for Integrated Circuits" Claude Hilbert et al. IEEE Transactions on Componets Hybrids, and Manufacturing Technology, vol. 13, No. 4, Dec. 1990.

Cunavelis er al., "External Module Heat Sink Fastened to Board" IBM Technical Disclosure Bulletin, vol. 14, No. 1, Jun. 1971, p. 182.

Almquist et al., "Spring–Clip Mounted Extruded Aluminum Heat Sink", IBM Technical Disclosure Bulletin, vol. 23, No. 12, May 1981, p. 5303.

(List continued on next page.)

*Primary Examiner*—Gregory Thompson
*Attorney, Agent, or Firm*—Blakely, Sokoloff, Taylor & Zafman

[57] ABSTRACT

A device and method for cooling an integrated circuit package—in particular, a microprocessor—within an enclosed computer system. The device comprises a blower, a first heat sink attached to the microprocessor, and a first air duct coupling the blower to the first heat sink. The blower has an air intake from the exterior of the computer system. The blower generates an air stream which flows through the first air duct to the first heat sink for cooling the first microprocessor. A second air duct connected to the first heat sink may be used to subsequently direct the air stream to a second heat sink for cooling a second microprocessor. An efficient ducted heat sink for use in this cooling system can be easily constructed by attaching two extruded heat sinks.

14 Claims, 4 Drawing Sheets

U.S. PATENT DOCUMENTS

| | | | |
|---|---|---|---|
| 4,833,766 | 5/1989 | Herrell et al. . | |
| 4,888,637 | 12/1989 | Sway-Tin et al. . | |
| 4,901,201 | 2/1990 | Crowe | 361/694 |
| 5,028,984 | 7/1991 | Ameen et al. . | |
| 5,077,601 | 12/1991 | Hatada et al. | 361/697 |
| 5,105,259 | 4/1992 | McShane et al. . | |
| 5,172,213 | 12/1992 | Zimmerman . | |
| 5,180,001 | 1/1993 | Okada et al. . | |
| 5,213,153 | 5/1993 | Itoh . | |
| 5,227,663 | 7/1993 | Patil et al. . | |
| 5,253,702 | 10/1993 | Davidson et al. . | |
| 5,276,584 | 1/1994 | Collins et al. | 361/690 |
| 5,289,039 | 2/1994 | Ishida et al. . | |
| 5,297,005 | 3/1994 | Gourdine | 361/697 |
| 5,349,498 | 9/1994 | Tanzer et al. | 361/689 |

FOREIGN PATENT DOCUMENTS

| | | | |
|---|---|---|---|
| 205935 | 8/1988 | Japan . | |
| 131443 | 2/1989 | Japan . | |
| 159841 | 7/1989 | Japan . | |
| 249457 | 2/1990 | Japan . | |
| 2237055 | 9/1990 | Japan . | |
| 78246 | 4/1991 | Japan . | |
| 3268483 | 11/1991 | Japan | 361/695 |
| 1691913 | 11/1991 | U.S.S.R. . | |
| 2167905 | 6/1986 | United Kingdom | 165/185 |

OTHER PUBLICATIONS

"Low Profile Heat Sink", IBM Technical Disclosure Bulletin, vol. 28, No. 12, May 1986, pp. 5172–5173.

"Stick–On Heat Sink", Research Disclosure, No. 270, Oct. 1986, 27104.

Conners, P.M., "Variable Area Heat Sink Device" IBM Technical Disclosure Bulletin, vol. 17, No. 4, Sep. 1974, p. 1016.

DUCTED OPPOSING BONDED FIN HEAT SINK BLOWER MULTI-MICROPROCESSOR COOLING SYSTEM

This is a continuation of application Ser. No. 08/643,736, filed May 6, 1996, now abandoned, which is a continuation of application Ser. No. 08/269,431, filed Jun. 30, 1994, now abandoned.

BACKGROUND OF THE INVENTION

1. Field of the Invention

The present invention relates to a heat sink cooling system for an integrated circuit package in an enclosed computer system.

2. Description of Related Art

Integrated circuits (ICs) are typically housed within a plastic or ceramic package. The packages have leads or surface pads that are soldered to a printed circuit board. The circuit board and package are often located within a computer chassis which contains a fan that removes the heat generated by the IC.

It is desirable to have a high rate of heat transfer from the IC package in order to maintain the junction temperatures of the integrated circuit within safe operating limits. Excessive IC junction temperatures may affect the performance of the circuit and cause a permanent degradation of the IC. Heat sinks are sometimes mounted to the top surface of the package housing to increase the thermal performance of the package. Conventional heat sinks typically have a plurality of fins that extend from a bottom base portion. The fins increase the surface area of the heat sink and the heat transfer rate of the package.

Microprocessors are a type of IC which often require a heat sink. For high performance microprocessors employed in an enclosed computer system, a high heat transfer rate is particularly important since the interior operating environment of typical computers is 10° C. to 25° C. above that of the air exterior to the enclosed computer system.

Several methods have been employed for cooling such high performance microprocessors. A common method of cooling such a microprocessor is by the use of a fan heat sink, in which an axial fan is attached to the heat sink atop the microprocessor in order to blow air across the heat sink to remove the heat dissipated by the microprocessor. To date, the best fan heat sinks are not thermally efficient enough to cool the higher powered new microprocessors.

One method of increasing the fan heat sink's efficiency, or lowering its thermal resistance, is to increase the speed of rotation of the fan prop, thereby forcing more air through the heat sink. The problem with this method is that at higher speeds of rotation, the fan consumes more power, further heating the fan motor bearings. Reliability of the fan heat sinks is a key concern for these high performance microprocessors. One failure mechanism of these small fans is a breakdown of the lubrication used in the bearings, which results at higher operating temperatures. Fan heat sinks have a drawback that they often require a system fan to move the heated air dissipated by the fan heat sink and to prevent recirculation of the heated air back to the fan heat sink.

Additionally, fan heat sinks have the drawback of having to operate in the elevated-temperature environment of the enclosed computer system. Subsequently, the fan heat sinks can encounter reliability problems due to operation at the elevated temperatures. Fan heat sinks also pose assembling problems since both a heat sink and a fan must be attached to each microprocessor.

Another approach is the use of passive heat sinks in combination with an axial system fan, but the large surface area requirements result in heat sink volumes that are too large for the typical computer chassis design.

Another approach involves the use of a liquid coolant to move the dissipated heat away from the microprocessor. Liquid cooling, however, is the least desirable and most expensive approach.

Accordingly, it would be advantageous to provide a reliable heat sink cooling system design. It would also be advantageous to provide a heat sink design which physically decouples the air mover (fan) from the heat sink.

It would also be advantageous to provide a cheap, easily constructed heat sink to efficiently dissipate the heat generated by the microprocessors.

SUMMARY OF THE INVENTION

A device and method is described herein for cooling an integrated circuit package—in particular, a microprocessor. The device and method are particularly useful for cooling high performance microprocessors, which can dissipate over 30 W of heat.

A microprocessor with a heat sink attached atop operates within a computer chassis. A blower, which has an air intake from a source external to the computer chassis, provides an air stream at its output. A first air duct is coupled to the blower, and a first ducted heat sink is coupled to the first air duct. The air stream flows through the first air duct and through the first ducted heat sink, thereby cooling the attached microprocessor.

A second air duct can be connected to the first ducted heat sink for directing the air stream to a second ducted heat sink in order to cool a second microprocessor attached to the second ducted heat sink. Although the air stream is slightly preheated from the heat dissipated from the first microprocessor, the air stream is still able to dissipate heat from the second microprocessor.

A ducted heat sink is required for the cooling system previously described. An opposing bonded fin heat sink is easily constructed using two extruded heat sinks. The two extruded heat sinks are attached such that the fins of one of the heat sinks are interleaved with the fins of the other heat sink. In the described embodiment, the heat sinks are attached by thermally conductive epoxy. Other methods of attachment include soldering, welding, or simply friction contact.

The cooling system can be employed to cool modular add-in cards, motherboards, and other electronic components in addition to microprocessors.

DETAILED DESCRIPTION OF THE PREFERRED EMBODIMENT

FIGS. 1 through 5 of the drawings disclose various embodiments of the present invention for purposes of illustration only. One skilled in the art will readily recognize from the following discussion that alternative embodiments of the structures and methods illustrated herein may be employed without departing from the principles of the invention. The following description may include specific numbers and quantities associated with the device and methods described herein. It should be apparent to one skilled in the art that these numbers and quantities are utilized herein for illustrative purposes.

Figure 1:
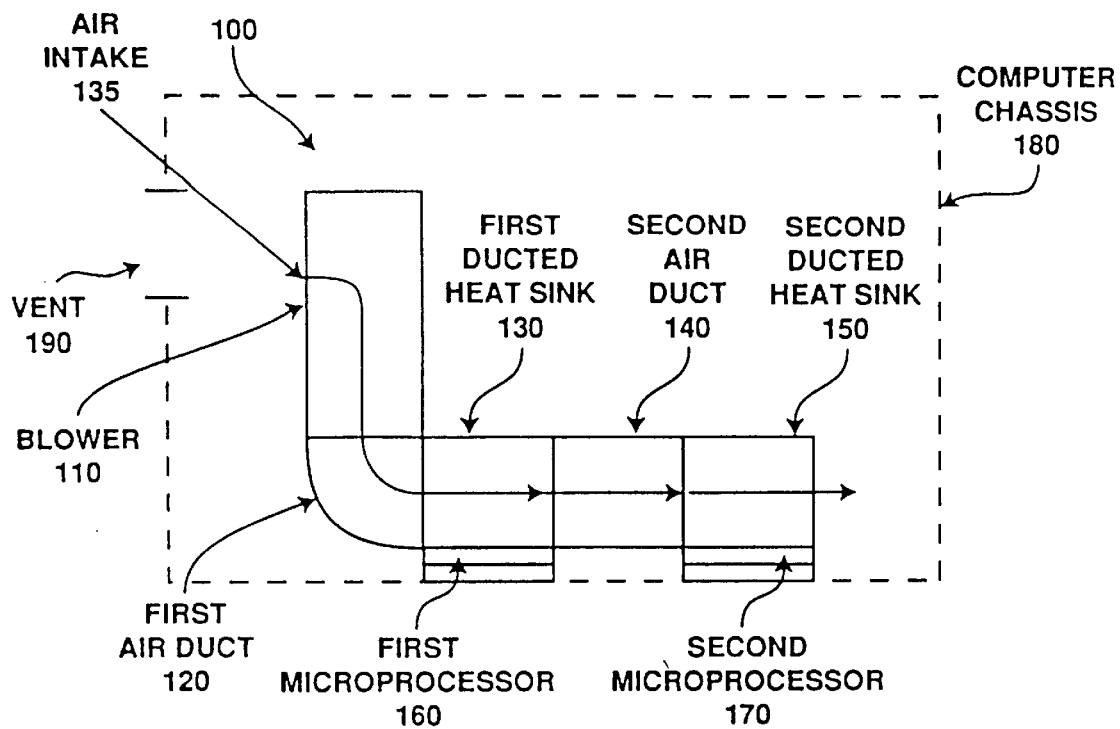
FIG. 1 is a block diagram of the ducted opposing bonded fin heat sink cooling system 100.
Figure 2:
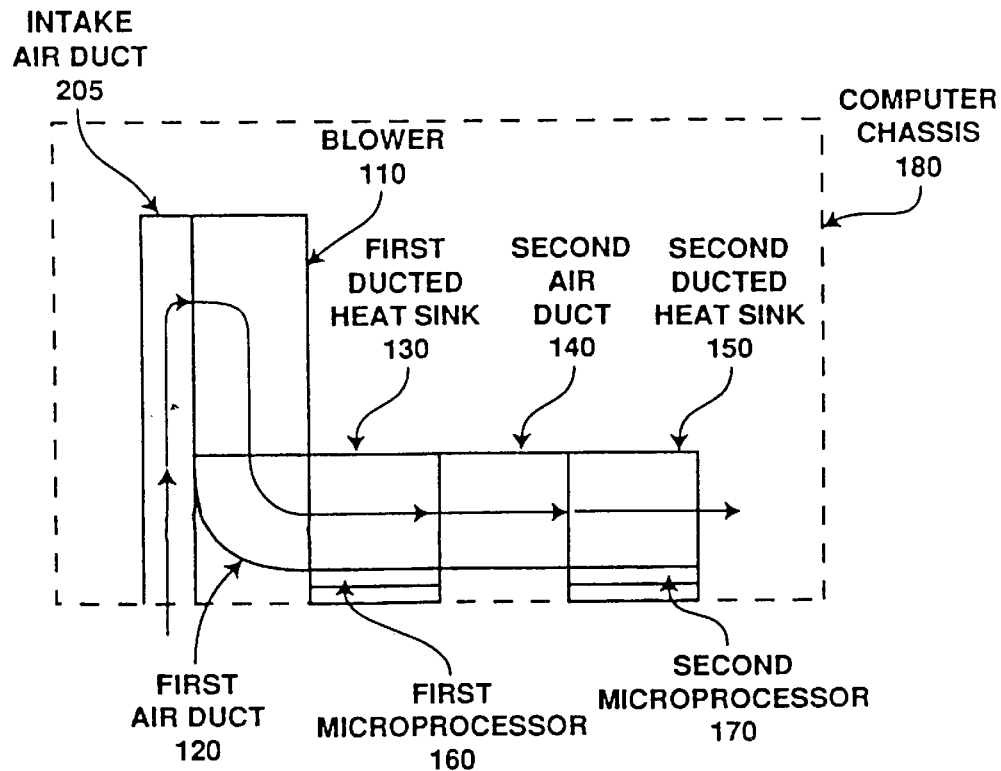
FIG. 2 is an alternative block diagram of the ducted opposing bonded fin heat sink cooling system 100.

FIG. 1 shows a block diagram of the ducted opposing bonded fin heat sink cooling system 100. The cooling system 100 is comprised of three main elements: a blower 110, a first air duct 120, and a first ducted heat sink 130. The blower 110 has an air intake 135 which allows the blower to receive air from a source external to the computer chassis 180. The blower 110 is coupled to the first air duct 120. The first air duct 120 is coupled to the first ducted heat sink 130. The cooling system can additionally include a second air duct 140 and a second ducted heat sink 150. The second air duct 140 couples the first ducted heat sink 130 to the second ducted heat sink 150.

The first ducted heat sink 130 is attached to a first microprocessor 160. The first ducted heat sink 130 dissipates heat from the first microprocessor 160. Similarly, the second ducted heat sink 150 is attached to a second microprocessor 170. The second ducted heat sink 150 dissipates heat from the second microprocessor 170.

In the described embodiment, the blower 110 is located in the interior of the computer chassis 180. A vent 190 in the computer chassis 180 allows air from the exterior of the computer chassis 180 to enter the blower 110. Alternatively, referring to FIG. 2, an intake air duct 205 can be employed to couple the air intake 135 of the blower 110 to an air source exterior to the computer chassis 180. Although the blower 110 could also be located exterior to the computer chassis 180, this is less desirable for noise and safety reasons.

In any case, the blower 110 receives air from the exterior of the computer chassis 180 and provides an air stream which flows through the first air duct 120, through the first ducted heat sink 130, through the second air duct 140, and through the second ducted heat sink 150.

It should be noted that the blower 110, the first air duct 120, the first ducted heat sink 130, the second air duct 140, and the second ducted heat sink 150 may all be detachable as required to meet assembly and manufacturing constraints as well as normal consumer modifications to the computer system.

It should also be noted that the cooling system must be designed such that the second microprocessor 170 has proper cooling since the air stream used to dissipate the heat of the second microprocessor 170 has been slightly preheated from the heat dissipated from the first microprocessor 160.

In the described embodiment, the blower 110 provides the static air pressure required to force air from the exterior of the system through the air intake duct and eventually through the ducted heat sinks 130 and 150 on the two microprocessors 160 and 170, which are cooled in series. The static pressure produced by the blower 110 is approximately three times that produced by axial fans. The blower 110 produces enough static pressure to generate high air velocities through the narrow heat sink channels. The resulting cooling system is very efficient. The air flow volume from the blower 110 is constrained such that all the air from the blower 110 is forced through the ducted heat sinks 130 and 150.

Axial fans are not capable of producing the required static pressure for generating such high air flow volumes. In current axial fan cooled systems, only a small amount of air from the system fan goes through the microprocessor heat sinks. This is even the case when the microprocessors are located directly in front of the axial fan near the motor. Thus, in the axial fan approach, only a small percentage of the air actually goes through the microprocessor's heat sinks, as opposed to the ducted heat sink approach using a blower 110 where all the air is forced through the ducted heat sinks 130 and 150 by the blower 110.

Additionally, the blower 110 may be thermally controlled so as to increase air flow when more cooling is required and decrease air flow when less cooling is required.

Figure 3A:
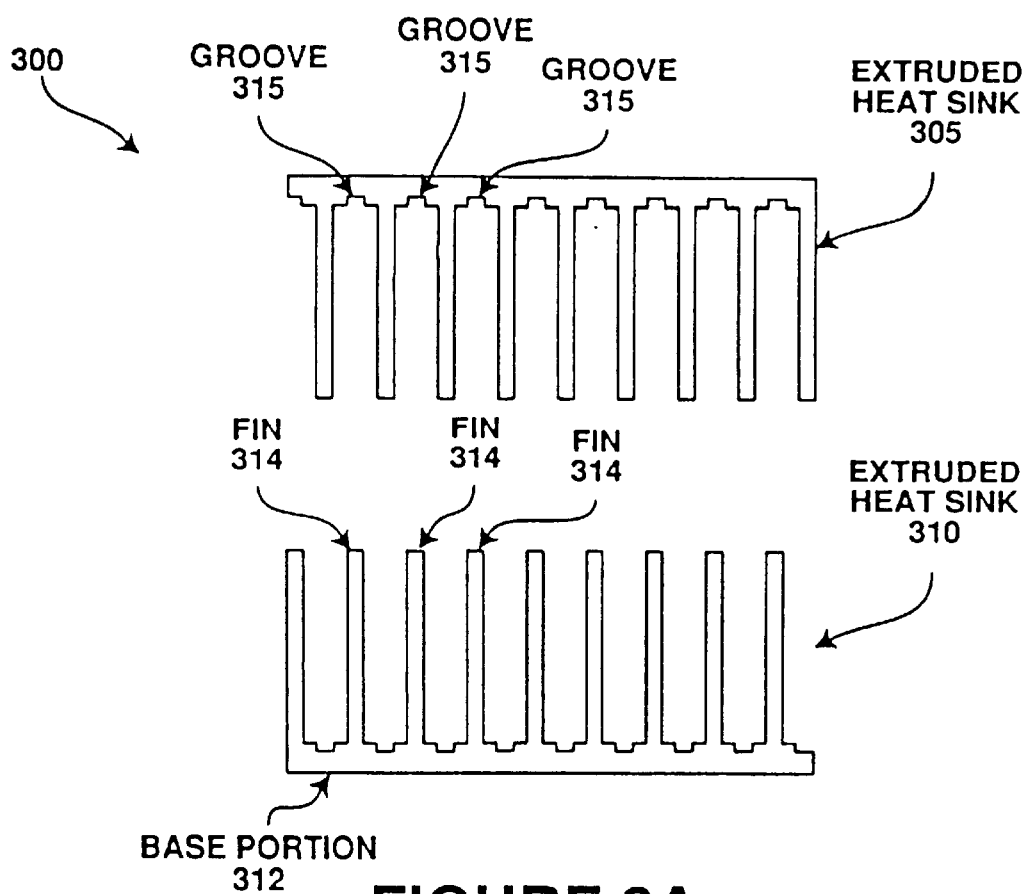
FIG. 3A is a diagram of a ducted opposing bonded fin heat sink 300 before attachment.

Reference is now made to FIG. 3A, which is a diagram of a ducted opposing bonded fin heat sink 300. The opposing bonded fin heat sink 300 is comprised of two identical extruded heat sinks 305 and 310. Each of the extruded heat sinks 305 and 310 are comprised of a base portion 312 and a plurality of fins 314 projecting transverse to the base portion 312.

Figure 3B:
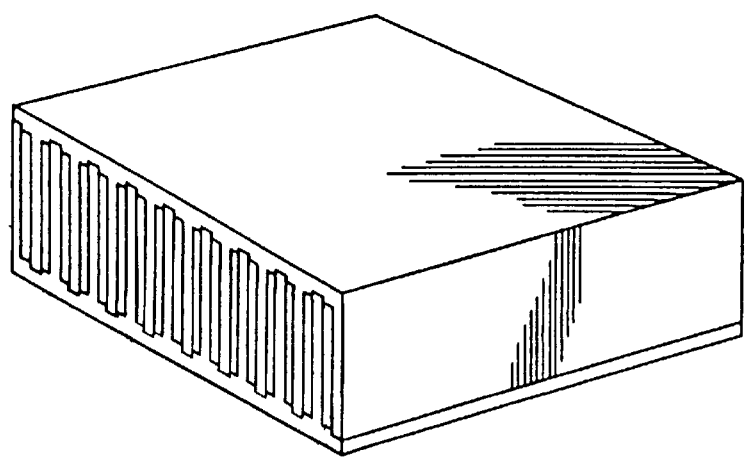
FIG. 3B is a representation of a ducted opposing bonded fin heat sink 300 after attachment.

The extruded heat sink 305 is inverted and rotated 180° from the extruded heat sink 310. The two extruded heat sinks 305 and 310 are then glued together with a thermally conductive epoxy. The presence of grooves 315 in each of the extruded heat sinks 305 and 310 allows for the placement of the fins of the opposite extruded heat sink. FIG. 3B shows extruded heat sinks 305 and 310 attached together.

Heat sinks typically require a large surface area to dissipate the heat from a microprocessor. For high efficiency, the air gaps between the fins must be very tall and narrow, as viewed from the end of the heat sink. An aspect ratio is the ratio of the air gap height to the air gap width for a given heat sink channel. Typically, the maximum aspect ratio for an extruded heat sink is 4 to 1. The requirements of high-power dissipating microprocessor heat sinks is about 10 to 1. By attaching the two extruded heat sinks 305 and 310 as described above, an effective aspect ratio of the opposing bonded heat sink 300 is created of approximately 10 to 1.

The opposing bonded heat sink 300 has the advantage of being cheap and easy to manufacture compared to other heat sinks with a comparable aspect ratio. To attain this same aspect ratio using conventional heat sink designs would require machining or individually gluing fin plates into a base plate at a cost of two to three times more per heat sink. In addition, these complex heat sinks would still require a shroud over the top in order to duct air flow through the heat sink. Conversely, the opposing bonded heat sink 300 has the advantage of automatically providing a duct (or a series of ducts) so that air flow from the blower 110 flows through the opposing bonded heat sink 300. A side benefit of the opposing bonded heat sink 300 is that the top surface can be used for labels.

Figure 4:
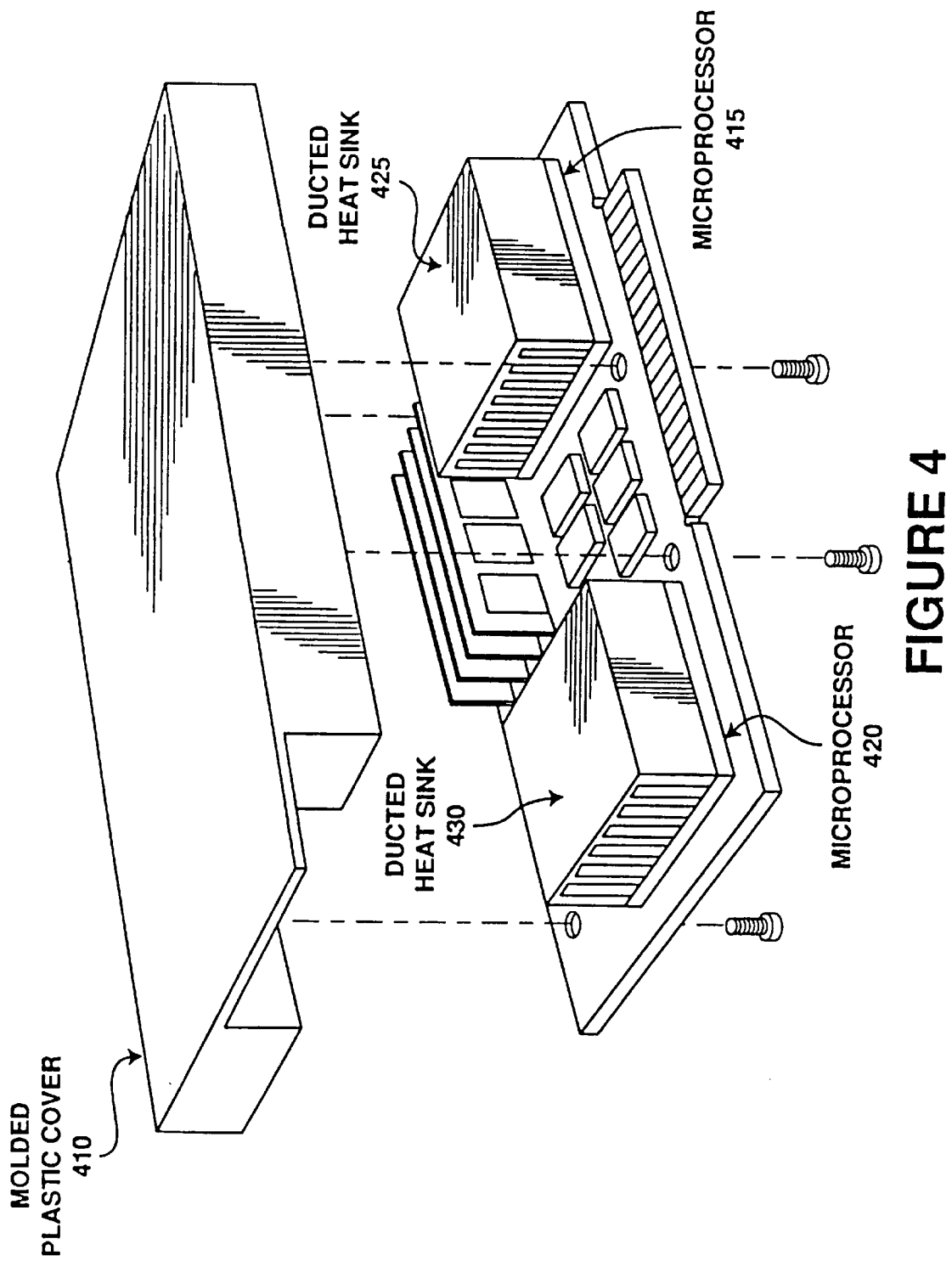
FIG. 4 is a representation of a cooling design for channeling air to two microprocessors as well as other electronic components.

Reference is now made to FIG. 4, which is a representation of a cooling design for channeling air to two microprocessors 415 and 420 as well as other electronic components. The above described cooling system can be employed to cool modular add-in cards, motherboards, and other electronic components in addition to microprocessors.

The connecting duct lengths, cross sectional area, and implementation details can vary depending on the system's design and microprocessor placement. Many variations of this invention can be realized using these basic ingredients of modifying and reorienting the air ducts. For example, in some cases, the system's axial fan can be directly replaced by the blower, thus minimizing the cost of the cooling system.

FIG. 4 shows the creation of an air channel by using a molded plastic cover 410. This molded plastic cover 410 encloses two microprocessors 415 and 420 along with two ducted heat sinks 425 and 430 as well as other electronic components.

Figure 5:
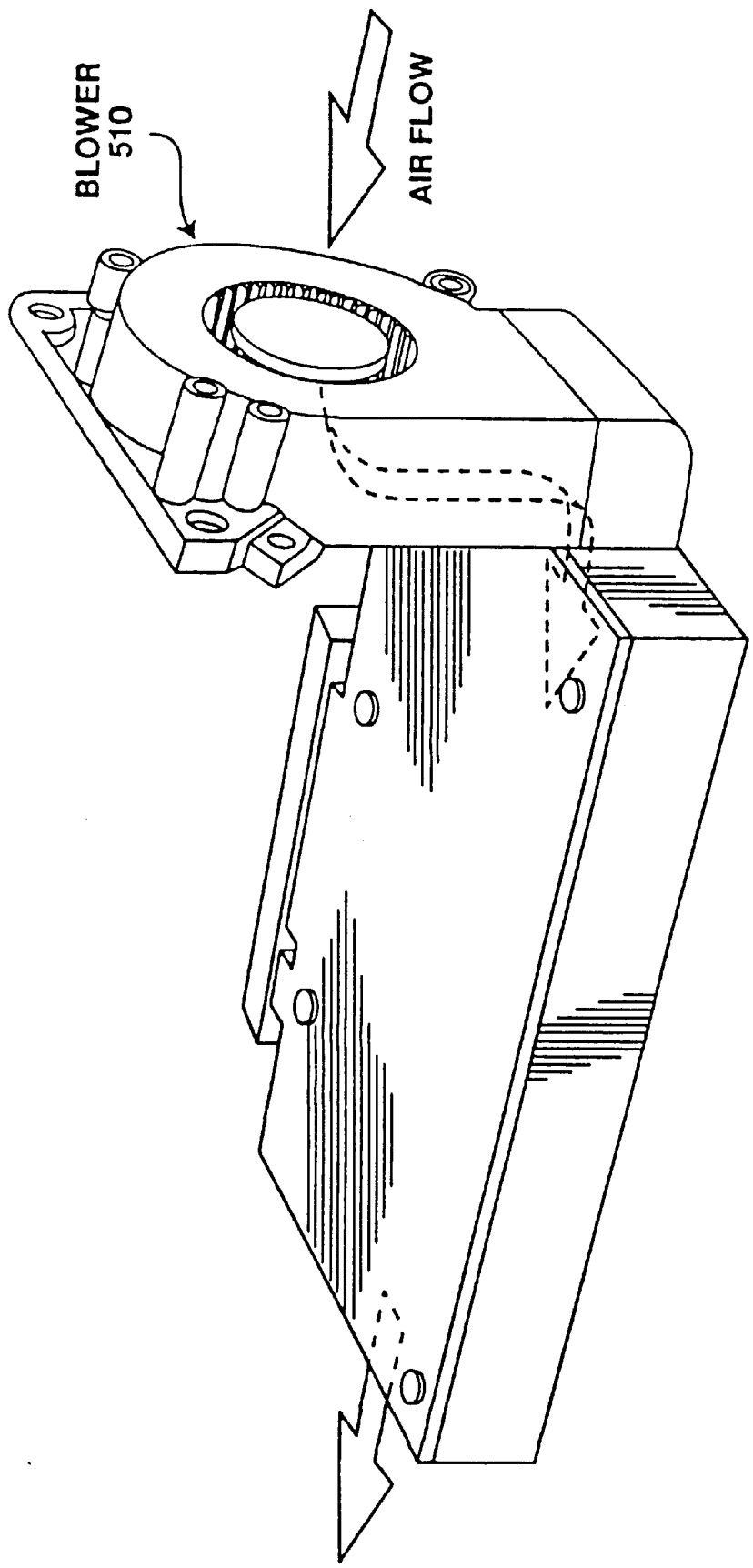
FIG. 5 is a representation showing how the air channel of FIG. 4 can be coupled to a blower 510.

FIG. 5 is a representation showing how the air channel of FIG. 4 can be coupled to a blower 510 in order to cool the two microprocessors 415 and 420 as well as the other electronic components within the molded plastic cover 410.

From the above description, it will be apparent that the invention disclosed herein provides a novel and advantageous heat sink cooling system. The foregoing discussion discloses and describes exemplary methods and embodiments of the present invention. As will be understood by those familiar with the art, the invention may be embodied in other specific forms without departing from its spirit or essential characteristics, and thus, the described embodiment is not restrictive of the scope of the invention. The following claims are indicative of the scope of the invention. All variations which come within the meaning and range of equivalency of the claims are to be embraced within their scope.

What is claimed is:

1. A cooling system for cooling an electrical component of a computer system comprising:
   (1) a blower controlled by a thermal sensor to control speed of air flow passing through the blower, the blower further configured to be positioned in a location independent from surfaces of electrical components to be cooled;
   (2) a first opposing bonded heat sink coupled to the electrical component, the first opposing bonded heat sink comprising:
      (A) a first extruded heat sink comprising a first base portion and a first plurality of fins projecting transverse to the first base portion; and
      (B) a second extruded heat sink identical to said first extruded heat sink comprising a second base portion and a second plurality of fins projecting transverse to the second base portion, the second extruded heat sink coupled to the first extruded heat sink such that the first and the second pluralities of fins interlock to form one or more ducts running through the first opposing bonded heat sink, the first and second plurality of fins having smooth surfaces, wherein the first opposing bonded heat sink further configured to be an air flow conduit as part of ducting system; and
   (3) a first air duct coupling the blower to the one or more ducts of the first opposing bonded heat sink, the first air duct configured in an elbow shape to provide an air flow path therein, wherein the air flow path is directed substantially parallel to a direction in which the one or more ducts run through the first opposing bonded heat sink.

2. The cooling system of claim 1 wherein the electrical component is a processor.

3. The cooling system of claim 1 wherein the electrical component is an integrated circuit.

4. The cooling system of claim 1 further comprising:
   an intake air duct connecting an air intake of the blower to the exterior of the computer system, wherein the intake air duct connects to the exterior of the computer system at a base area of the computer system.

5. The cooling system of claim 1 wherein the first extruded heat sink has a first edge fin at one edge of the first base portion and a first edge groove at the other edge of the first base portion, the second extruded heat sink has a second edge fin at one edge of the second base portion and a second edge groove at the other edge of the second base portion, and the first extruded heat sink and the second extruded heat sink are disposed with the first edge fin of the first extruded heat sink interlocked with the second edge groove of the second extruded heat sink and the first edge groove of the first extruded heat sink interlocked with the second edge fin of the second extruded heat sink.

6. The cooling system of claim 1 further comprising:
   (4) a second opposing bonded heat sink connected to a second electrical component, the second opposing bonded heat sink comprising
      (A) a third extruded heat sink comprising a third base portion and a third plurality of fins projecting transverse to the third base portion;
      (B) a fourth extruded heat sink comprising a fourth base portion and a fourth plurality of fins projecting transverse to the fourth base portion, the fourth extruded heat sink coupled to the third extruded heat sink such that the third and the fourth pluralities of fins interlock to form a second plurality of ducts running through the second opposing bonded heat sink, the second opposing bounded heat sink further configured to guide air flow substantially parallel to surfaces of electrical components to be cooled, the second opposing bounded heat sink further configured to have each air gap consisting a ratio of greater than 4 to 1 between the height and width of the air gap; and
   (5) a second air duct connecting the first opposing bonded heat sink to the second opposing bonded heat sink, the second air duct further configured to guide air flow in a direction substantially parallel to surfaces of electrical components to be cooled.

7. A cooling system as claimed in claim 1 wherein said blower is controlled by said thermal sensor so as to increase air flow when more cooling is required and decrease air flow when less cooling is required.

8. A cooling system for cooling an electrical component of a computer system comprising:
   (1) a blower;
   (2) a first opposing bonded heat sink coupled to the electrical component, the first opposing bonded heat sink comprising
      (A) a first extruded heat sink comprising a first base portion and a first plurality of fins projecting transverse to the first base portion; and
      (B) a second extruded heat sink comprising a second base portion and a second plurality of fins projecting transverse to the second base portion, the second extruded heat sink coupled to the first extruded heat sink such that the first and the second pluralities of fins interlock to form one or more ducts running through the first opposing bonded heat sink, the first and second plurality of fins having smooth surfaces, the first and second extruded heat sinks having an aspect ration greater than 4 to 1; and
   (3) a first air duct cooling the blower to the one or more ducts of the first opposing bonded heat sink, the first air duct providing an air flow path therein, wherein the air flow path is directed substantially parallel to a direction in which the one or more ducts run through the first opposing bonded heat sink, the blower, the first air duct and the first opposing bonded heat sink coupled in an elbow shape configuration, wherein the elbow shape configuration guides an air flow in a direction substantially parallel to surfaces of electrical components to be cooled.

9. The cooling system of claim 8 wherein the electrical component is a processor.

10. The cooling system of claim 8 wherein the electrical component is an integrated circuit.

11. The cooling system of claim 8 further comprising an intake air duct connecting an air intake of the blower to the exterior of the computer system.

12. The cooling system of claim 8 further comprising an intake air duct connecting an air intake of the blower to the exterior of the computer system, wherein the intake air duct connects to the exterior of the computer system at a base area of the computer system.

13. The cooling system of claim 8 further comprising:
 (4) a second opposing bonded heat sink connected to a second processor, the second opposing bonded heat sink comprising
  (A) a third extruded heat sink comprising a third base portion and a third plurality of fins projecting transverse to the third base portion;
  (B) a fourth extruded heat sink comprising a fourth base portion and a fourth plurality of fins projecting transverse to the fourth base portion, the fourth extruded heat sink coupled to the third extruded heat sink such that the third and the fourth pluralities of fins interlock to form a second plurality of ducts running through the second opposing bonded heat sink; and
 (5) a second air duct connecting the first opposing bonded heat sink to the second opposing bonded heat sink.

14. A cooling system as claimed in claim 8 wherein said blower is thermally controlled so as to increase air flow when more cooling is required and decrease air flow when less cooling is required.

\* \* \* \* \*